(12) United States Patent
Kalinoski et al.

(10) Patent No.: US 6,331,349 B1
(45) Date of Patent: *Dec. 18, 2001

(54) FORM-IN-PLACE EMI GASKETS

(75) Inventors: John P. Kalinoski, Chelmsford, MA (US); Michael H. Bunyan, Derry, NH (US)

(73) Assignee: Parker-Hannifin Corporation, Cleveland, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 09/478,017

(22) Filed: Jan. 5, 2000

Related U.S. Application Data

(60) Continuation of application No. 08/967,986, filed on Nov. 12, 1997, now Pat. No. 6,096,413, which is a continuation of application No. 08/421,847, filed on Mar. 14, 1995, now abandoned, which is a division of application No. 08/119,403, filed on Sep. 10, 1993, now abandoned.

(51) Int. Cl.[7] .................................................... H05K 9/00
(52) U.S. Cl. ............... 428/220; 174/35 R; 174/35 GC; 174/35 MS; 252/510; 252/511; 252/514; 252/521.3; 428/328; 428/425.8; 428/425.9; 428/450; 428/458; 428/480
(58) Field of Search ................... 174/35 R, 35 GC, 174/35 MS; 428/328, 220, 425.8, 425.9, 450, 462, 463, 35.8, 458, 480; 252/510, 511, 514, 521.3

(56) References Cited

U.S. PATENT DOCUMENTS

| | | | |
|---|---|---|---|
| 2,796,457 | 6/1957 | Stinger | 174/35 GC |
| 3,032,528 | 5/1962 | Nitzsche et al. | 528/34 |
| 3,126,440 | 3/1964 | Goodloe | 174/35 GC |
| 3,140,342 | 7/1964 | Ehrreich et al. | 174/35 GC |
| 3,752,899 | 8/1973 | Bakker | 174/35 GC |
| 3,880,627 | 4/1975 | Morton | 55/499 |

(List continued on next page.)

FOREIGN PATENT DOCUMENTS

| | | |
|---|---|---|
| A-63355/94 | 12/1994 | (AU) . |
| 1116650 | 1/1982 | (CA) . |
| 2125742 | 12/1994 | (CA) . |
| 8912397.2 | 1/1990 | (DE) . |
| 4219915 | 12/1993 | (DE) . |
| 4237217 | 5/1994 | (DE) . |
| 9404291.8 | 7/1994 | (DE) . |
| 0182391 | 5/1986 | (EP) . |
| 0194230 | 9/1986 | (EP) . |
| 0200296 | 12/1986 | (EP) . |
| 0241192 | 10/1987 | (EP) . |

(List continued on next page.)

OTHER PUBLICATIONS

Communication of Sep. 9, 2000 from European Patent Office issued in counterpart application.
*Dynafoam™ Technical Guide, Mar. 1992.
*King, G.D., SAE Technical Series, "Improved Foam In Place Gasket Material" Feb. 26–Mar. 2, 1990.
*Chomerics Technical Bulletin 46, (1 pages) 1987.
*Chomerics Technical Bulletin E46, (1 page) 1990.
*European Search Report from patent case.
Informal English Translation of DE 9404291.8.

*Primary Examiner*—D. S. Nakarani
(74) *Attorney, Agent, or Firm*—Ropes & Gray

(57) ABSTRACT

A form in place conductive gasket is disclosed. The gasket, foamed, gelled or unfoamed is made of one or more elastomer resins, such as silicone urethane and/or thermoplastic block copolymers and is either filled with a conductive filler and lined onto a desired substrate or lined onto the substrate unfilled and then coated with a conductive outerlayer, such as a silver filled elastomer or a conductive flocked layer. A process and system for making the gaskets are also disclosed.

7 Claims, 3 Drawing Sheets

U.S. PATENT DOCUMENTS

| | | | |
|---|---|---|---|
| 3,889,043 | 6/1975 | Ducros | 174/35 GC |
| 4,011,360 | 3/1977 | Walsh | 428/402 |
| 4,037,009 | 7/1977 | Severinsen | 428/241 |
| 4,295,573 | 10/1981 | Terry et al. | 215/348 |
| 4,434,541 | 3/1984 | Powers, Jr. | 29/525.1 |
| 4,507,359 | 3/1985 | Powers, Jr. | 428/328 |
| 4,643,863 | 2/1987 | Martini | 264/219 |
| 4,643,864 | 2/1987 | Martini | 264/220 |
| 4,643,924 | 2/1987 | Uken et al. | 428/35.7 |
| 4,664,971 | 5/1987 | Soens | 428/288 |
| 4,678,716 | 7/1987 | Tzeng | 428/551 |
| 4,678,863 | 7/1987 | Reese et al. | 174/35 GC |
| 4,690,831 | 9/1987 | Uken et al. | 427/44 |
| 4,734,140 | 3/1988 | Tzeng | 148/126.1 |
| 4,769,280 | 9/1988 | Powers, Jr. | 428/328 |
| 4,779,762 | 10/1988 | Klein et al. | 222/52 |
| 4,832,349 | 5/1989 | Kawai et al. | 277/12 |
| 4,857,666 | 8/1989 | Buonanno | 174/35 GC |
| 4,861,643 | 8/1989 | Scollard | 428/162 |
| 4,865,905 | 9/1989 | Uken | 428/220 |
| 4,869,954 | 9/1989 | Squitieri | 428/283 |
| 4,882,089 | 11/1989 | Iwaskow et al. | 428/242 |
| 4,900,877 | 2/1990 | Dubrow et al. | 174/35 GC |
| 4,915,985 | 4/1990 | Maxfield et al. | 427/126.6 |
| 4,931,326 | 6/1990 | Weil | 428/35.8 |
| 4,931,479 | 6/1990 | Morgan | 521/76 |
| 4,948,922 | 8/1990 | Varadan et al. | 174/35 GC |
| 4,950,521 | 8/1990 | Takamura et al. | 428/78 |
| 4,977,295 | 12/1990 | Chin et al. | 174/35 GC |
| 5,008,485 | 4/1991 | Kitagawa | 174/35 GC |
| 5,045,625 | 9/1991 | Kaplo et al. | 174/35 GC |
| 5,047,260 | 9/1991 | Durand | 427/54.1 |
| 5,049,332 | 9/1991 | Ziemer et al. | 264/104 |
| 5,068,493 | 11/1991 | Benn, Sr. et al. | 174/35 C |
| 5,107,070 | 4/1992 | Benn, Sr. et al. | 174/35 GC |
| 5,115,104 | 5/1992 | Bunyan | 174/35 GC |
| 5,137,766 | 8/1992 | Mazanek et al. | 428/68 |
| 5,147,691 | 9/1992 | Shimamoto et al. | 427/387 |
| 5,187,225 | 2/1993 | Kitagawa | 524/847 |
| 5,202,536 | 4/1993 | Buonanno | 174/35 GC |
| 5,250,607 | 10/1993 | Comert et al. | 524/507 |
| 5,256,480 | 10/1993 | Inoue et al. | 428/311 |
| 5,284,888 | 2/1994 | Morgan | 524/93 |
| 5,326,611 | 7/1994 | Kishita et al. | 428/78 |
| 5,340,847 | 8/1994 | Hanazuka et al. | 522/11 |
| 5,364,676 | 11/1994 | Takago et al. | 428/35.7 |
| 5,366,664 | 11/1994 | Varadan et al. | 252/512 |
| 5,473,111 | 12/1995 | Hattori et al. | 174/35 R |
| 5,684,110 | 11/1997 | Kawamura | 528/15 |
| 5,882,729 | 3/1999 | Kahl et al. | 427/265 |

FOREIGN PATENT DOCUMENTS

| | | |
|---|---|---|
| 0326704 | 8/1989 | (EP) . |
| 0 368 612 A1 | 5/1990 | (EP) . |
| 0 539 234 A2 | 4/1993 | (EP) . |
| 0588321 | 3/1994 | (EP) . |
| 0 629 114 A1 | 12/1994 | (EP) . |
| 0 643 552 A1 | 3/1995 | (EP) . |
| 2480488 | 10/1981 | (FR) . |
| 802358 | 10/1958 | (GB) . |
| 2 115 084 A | 9/1983 | (GB) . |
| 2115084 | 9/1983 | (GB) . | ered as it drives up the cost of such parts unacceptably. Further as diecutting is a rough process, the sheet stock needs to be fairly stiff and self supportive which is opposite that desired by the gasket user (i.e. soft and flexible).

FORM-IN-PLACE EMI GASKETS

RELATED APPLICATIONS

This application is a continuation of application Ser. No. 08/967,986, filed Nov. 12, 1997, now U.S. Pat. No. 6,096,413, which is a continuation of application Ser. No. 08/421,847, filed, Mar. 14, 1995, now abandoned; which is a division of application Ser. No. 08/119,403, filed Sep. 10, 1993, now abandoned.

The present invention relates to conductive form-in-place gaskets. More particularly, it relates to conductive form-in-place gaskets having two, three or more axes of direction (e.g. X, Y and/or Z) and a process and system for making them.

BACKGROUND OF THE INVENTION

EMI shielding gaskets are used on electronic equipment to provide protection against interference from electromagnetic energy, including radio frequency interference (RFI) and more broadly all bands of interference commonly called electromagnetic interference (EMI). The shielding has an electrically conductive element, be it a wire mesh, conductive filler or conductive plating, coating or fabric which prevents external EMI from interfering with an electronic device and/or protects other adjacent electronic devices from EMI emitted by an electronic device.

Typically, EMI gaskets are prepared in one of three configurations: linear, die cut or compression molded. By linear, it is meant as an extrusion, molding, etc. of a defined, straight length. By die cut, it is meant that a gasket configuration is formed from a conductive sheet material which is cut by a die to the desired shape, such as round, square, etc. By compression molded, it is meant that the gasket configuration is formed by placing uncured elastomer which may contain conductive filler or a conductive mesh, into a specifically designed mold which is then subjected to compression (pressure) and then cured to cause the elastomer to assume the desired gasket configuration.

All three methods have disadvantages especially when used to form complex multidirectional or multiaxial gaskets, such as may occur in devices with a number of compartments that each need to be shielded, from each other as well as the external environment. Moreover, the problems are even more critical on smaller devices, such as cellular phones, notebook computers and other hand held devices, where the diameter of the gasket becomes very small and the ability to manufacture and attach such gaskets securely becomes very difficult and labor intensive.

Using linear gasketing material to form complex multiaxis/multidirectional gaskets (e.g. either x and y or in the x, y and z planes), is difficult, time consuming and costly. Each gasket portion must be hand cut and bonded to the adjacent portions of other linear gaskets and then bonded or secured in position upon the substrate.

Die cutting of conductive sheet stock will work in many instances especially in two plane (e.g. flat; x,y) applications, provided that each portion of the gasket is wide enough and/or thick enough to be self supportive. Die cutting parts however results in significant waste of the sheet stock because the material is typically a crosslinked resin such as silicone or polyurethane. This is not acceptable as it drives up the cost of such parts unacceptably. Further as diecutting is a rough process, the sheet stock needs to be fairly stiff and self supportive which is opposite that desired by the gasket user (i.e. soft and flexible).

Compression molding is slow and again generates scrap in the form of flash which must be removed. Further, each gasket design must use a specifically designed mold, making the process expensive for all but large volume stock items.

A form in place EMI gasket and system for forming complex multiaxis/multidirectional EMI gaskets which generates a minimum of scrap, which forms the gasket in place and requires no special tooling is desired. The present invention provides such a system.

OBJECTS AND SUMMARY OF THE INVENTION

The present invention relates to a form-in-place EMI gasket and a system for forming such a gasket using a table and/or dispenser that are capable of moving in multiaxial directions relative to each other and the substrate to be gasketed. The invention also relates to a process of providing a conductive elastomer, forming it in place along a desired gasket configuration so as to create form-in-place EMI gasket.

An object of the present invention is an EMI shielded substrate comprising:
  a.) a first electrically conductive substrate;
  b.) a second electrically conductive substrate adjacent to the first substrate;
  c.) a formed in place electrically conductive gasket formed on and bonded to a predetermined portion of the first substrate so as to provide an electrical connection and EMI shielding between the first and second substrates.

A further object of the present invention is an EMI shielded substrate comprising:
  a.) a substrate having an electrically conductive surface;
  b.) a cover for the substrate, the cover having an electrically conductive surface which corresponds to and is in register with the conductive surface of the substrate; and
  c.) a formed in place electrically conductive gasket formed on and bonded to a predetermined portion of the conductive surface of the substrate or cover so as to provide an electrical connection and EMI shielding between the substrate and cover upon the mating of the cover to the substrate.

Another object of the present invention is an EMI gasket comprising a composition formed of:
  a.) a first component which is a primary polymer having end groups that are capable of chemically reacting with each other in the presence of moisture to form a derivative polymer having a longer average chain length than said primary polymer;
  b.) a second component which is a noncross-linked elastomer that is not substantially chemically reactive with itself or with said first component; and
  c.) a third component which is one or more electrically conductive fillers, wherein when said first, said second, said third components are intimately mixed, said composition, when maintained in the absence of moisture and other active hydrogen donor materials, are readily extrudable and otherwise conventionally moldable thermoplastic composition but, upon exposure to moisture, become essentially thermoset.

These and other objects of the invention will become clear from the following description and claims.

DETAILED DESCRIPTION OF THE INVENTION

The present invention relates to a form-in-place EMI gasket.

Such gasket are useful when positioned between two adjacent substrates such as a box cover, so as to form an electrical bridge or continuity between the two substrates and thereby prevent or reduce the potential for EMI.

Figure 1:
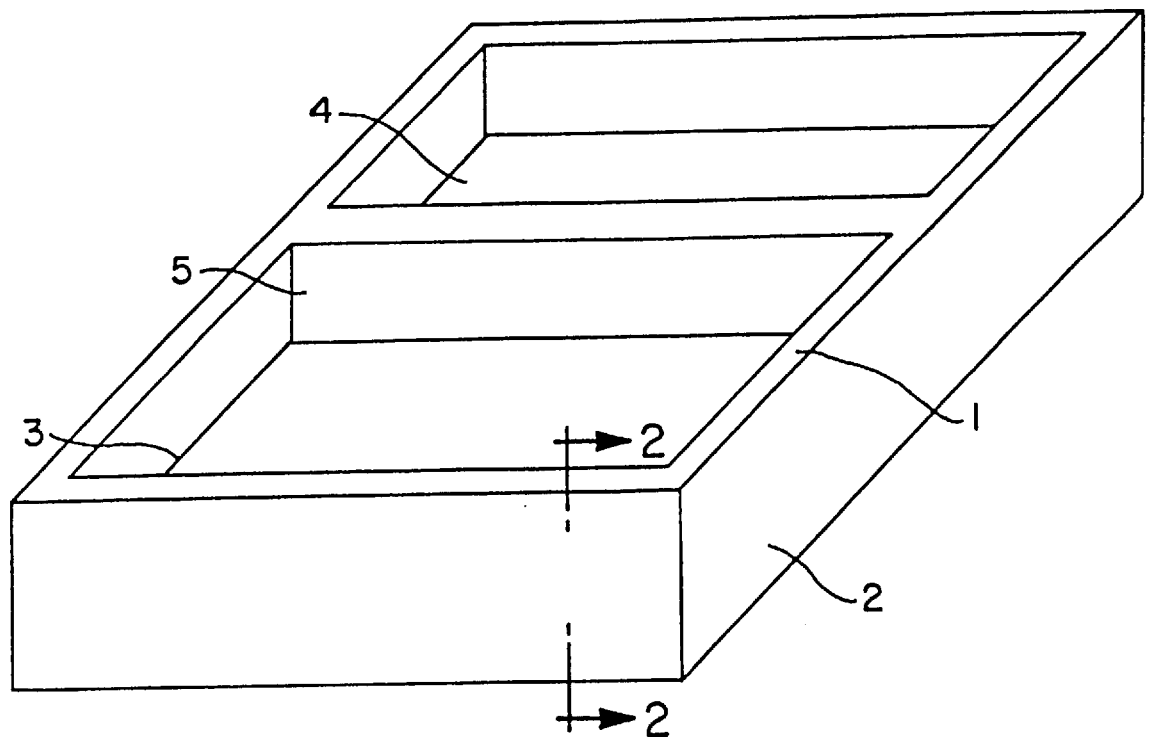
FIG. 1 illustrates in planar view a preferred configuration of a form-in-place conductive EMI gasket, having a complex physical structure comprising a series of elongated sections in the x, y axis, on a desired substrate.

FIG. 1 shows a preferred embodiment of the present invention. The form in place conductive gasket 1 is mounted on a preselected section or sections of a substrate 2 which is to be shielded. In FIG. 1, the substrate 2 is a modular enclosure formed of two compartments 3, 4 separated by a wall 5. Such an enclosure can be a cellular phone carcass, a switching box, hard disk drive case, etc. As can be seen, the gasket 1 is formed in place along the edges of the enclosure which will mate with a cover (not shown).

Figure 2:
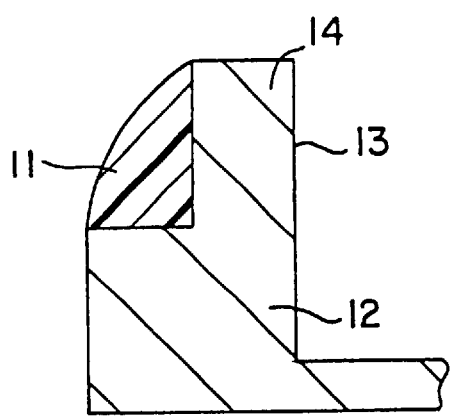
FIG. 2 shows in crosssection a preferred embodiment of the gasket of FIG. 1.

FIG. 2 shows the conductive form in place gasket 11 in crosssection as mounted to the enclosure 12. In this embodiment, the area of the enclosure to be gasketed 13 has a shoulder 14 against which the gasket is formed. Other embodiments may not have the shoulder 14, being flat instead, or may use other locating devices such as undercuts, dovetails, channels, etc. into which or against which the gasket may be formed.

The form in place gasket overcomes many of the problems of the prior approaches. It eliminates the necessity to form the gasket and then apply it in a separate step as occurs with the linear or die cut gaskets. It reduces waste as occurs with die cut or compression molded gaskets by being a flashless or scrapless process. It is less labor intensive than linear or die cut gaskets as there is no hand assembly of complex gasket shapes or mounting of the gaskets into place. Further, there is no need for the manufacture of specialized dies or molds which are useful for only one gasket configuration. Instead, the gasket can be applied to any substrate, in any configuration, easily and in a cost effective manner with a minimal investment for tooling. Moreover, with the use of preprogrammable application equipment, one can store an infinite number of gasket configurations which can be called up and used quickly and repeatedly without the necessity to manufacture a specific die or a mold.

Lastly, it allows for the exact placement of very small diameter gaskets (e.g. 0.010 inch diameter or less) which is difficult to achieve with all but compression molding.

The word "elastomeric" should be given its usual meaning given the purpose for which the invention is intended. The elastomer bases used in the invention can be thermosetting resins; e.g. resins which to cross-link and subsequently cure either at a critical temperature or in the presence of a curing agent/catalyst such as peroxide, photoinitiator, moisture, etc. Any flexible thermosetting elastomer base is suitable for use in the invention, such as EPDM copolymers, silicone rubbers, fluorosilicone rubbers, urethane rubbers, nitrile ribbers, butyl rubbers, and mixtures thereof.

Elastomeric thermoplastics may also be used. Thermoplastic rubbers, such as various block copolymers (KRATON® rubber, NORPRENE® resin or SANTOPRENE® resin) are particularly useful. Omission of other elastomers is not meant to specifically exclude their use in the invention. Certain physical or electrical requirements of the application for which the gaskets are intended may dictate that particular elastomeric compositions be used.

The selected material should be sufficiently viscous and/or form stable so that it does not slump, sag or run between the time of application and the time of curing. It may be in the form of a paste, a caulk, a gel or viscous fluid. Alternatively, when the material has a fast curing cycle or creates an initially stable material such as a gel or a skinned or foam structure upon application, the material as applied can be a relatively thin or non-viscous fluid.

In addition, the selected resin should form a soft, resilient, compression set resistant gasket even with the addition of relatively High loading of conductive fillers, if used.

Preferred elastomers that meet the requirements above include silicone rubbers, whether foamed or unfoamed; silicone gels, whether foamed or unfoamed, typically such gels are relative soft silicone rubber which may have been extended with oils or plasticizers or which are only lightly crosslinked; polyurethanes, especially the prepolymer type of urethane in which the prepolymer is capped or terminated with an isoacyanate group which when exposed to an activating agent (typically a hydroxy containing group), such as water, amines or alcohols cause the prepolymer to a crosslink; elastomeric thermoplastic rubbers such as DYNAFOAME® and NORPRENE® from Norton Co.; SANTOPRENE® resin from Monsanto, and KRATON® rubber from Shell Oil. These thermoplastics generally comprise at least a block copolymer, such as SBS or SIS rubber with or without other polymers (polyethylene, polystyrene, etc.) and/or oils or plasticizers. Additionally, various blends of the elastomers can be used as well.

Such polymers are generally known and widely available, see e.g. U.S. Pat. Nos. 4,931,479, 4,643,924 and EP Patent Application 0326704A.

An EMI gasket can be formed of a composition as taught by EP Patent Application 0326704A by using a two component polymer system, one which is thermoplastic in the nature, the other being thermoset when exposed to moisture or active hydroxyl groups.

The first component which is a primary polymer having end groups that are capable of chemically reacting with each other in the presence of moisture to form a derivative polymer having a longer average chain length than said primary polymer, such as an isocyanate capped polyester prepolymer;

The second component which is noncross-linked elastomer that is not substantially chemically reactive with itself or with said first component in the presence of moisture, such as a block copolymer e.g. styrene-butadiene-styrene block copolymers, and a third component which is one or more electrically conductive fillers wherein the first, the second, and the third components are intimately mixed, and the composition, when maintained in the absence of moisture and other active hydrogen donor materials, form a readily extrudable and otherwise conventionally moldable or coatable thermoplastic composition but, upon exposure to moisture, becoming essentially thermoset.

A preferred silicone gel is known as SYLGARD J27 (Parts A and B) available from Dow Corning Corporation. It can be mixed with one or more conductive fillers to form an EMI material.

The gasket may be rendered electrically conductive either through the use of a conductive filler incorporated into the elastomer base and/or the use of an electrically conductive outer layer formed over a core which may be conductive or nonconductive.

The fillers that are used to impregnate elastomers to make them electrically conductive are well-known in the art. Examples of these fillers include but are not limited to electrically conductive noble metal-based fillers such as pure silver; noble metal-plated noble metals such as silver plated gold; noble metal-plated non-noble metals such as silver plated copper, nickel or aluminum, for example, silver plated aluminum core particles or platnium plated copper particles; noble-metal plated glass, plastic or ceramics such as silver plated glass microspheres, noble-metal plated alumina or noble-metal plated plastic microspheres; noble-metal plated mica; and other such noble-metal conductive fillers. Non-noble metal-based materials are also suitable, including non-noble metal-plated non-noble metals such as copper-coated iron particles or nickel plated copper; non-noble metals, e.g. copper, aluminum, nickel, cobalt; and non-metal materials such as carbon black and graphite and combinations of the fillers to meet the desired conductivity, hardness and other parameters desired for a particular application.

The shape and size of the electrically conductive fillers is not critical to the present invention. The fillers may be of any shape that is generally used in the manufacture of conductive materials, including spherical, flake, platelet, irregular or fibrous (such as chopped fibers). In making gaskets in accordance with the invention it is preferred that the particle shape be spherical, substantially spherical or irregular. Flake or platelet shaped fillers are preferred when used in forming an outer conductive coating for the foam-in-place gasket.

The particle size of the electrically conductive fillers can be within the range normally used for fillers in conductive materials. Generally the particle size of the one or more fillers is from about $0.250\mu$ to about $250\mu$, preferably from about $0.250\mu$ to about $75\mu$, and most preferably from about $0.250\mu$ to about $60\mu$.

The amount, or loading, of the one or more electrically conductive fillers in the conductive elastomeric material used in the present invention can vary over a wide range, as long as the electrically conductive filler is present in an amount sufficient to provide EMI/RFI shielding properties. Generally loading of the filler particles in the conductive elastomeric material is from about 10 to about 80 volume percent, preferably from about 20 to about 66 volume percent.

When a conductive outer layer is used to provide the conductivity to the gasket, it may be in the form of a plating, a coating or a film. Plated layers, such as silver plating, are not preferred as the platings tend to be rigid and crack under compression. Films, such as a conductive filled polyethylene or polyimide, may be used.

Preferably, the outer conductive layer is some form of conductive coating. More preferably it is a conductively filled resilient coating. Such coatings can and preferably are based upon the same elastomer resin that is used to form the inner layer. Preferred coatings include silicone, polyurethane, acrylic and epoxy resins filled with one or more of the conductive fillers in the same size range and amounts as described above.

Other fillers and ingredients may also be added to the elastomer base if desired. Such fillers include microwave absorbing materials, thermally conductive fillers, inert or reinforcement fillers such as silicas and pigmentation fillers. Additionally, curing agents, cross linking agents, flame retardants, diluents, solvents or dispersion aids, etc., may be added as is well known in the art to form the desired conductive elastomeric material. In addition the elastomers may additionally comprise other compounds, such as plasticizers, extender oils, softeners, tackifiers catalysts, blowing agents or other agents that impart desired properties to the cured gasket.

Typically, the gasket should have a SHORE A hardness (as measured by ASTM standards) of between 5 and 60, preferably 5 and 50 and more preferably 5 and 40. The properties of the gasket will vary depending upon the resin chosen, whether it is foamed or not, the amount of filler contained therein and the other constituents (oils, plasticizers, reinforcing fillers etc.) that may be added.

A typical form in place gasket should have a low closure force, e.g. a force of less than about 5 pounds/linear inch preferably less than 3 pounds, and more preferably less than 1 pound to deflect the gasket sufficently to ensure proper electrical continuity between the two adjacent substrates.

Before curing, the fluid-like gasket material should be capable of being distributed by automated equipment (if so desired) in diameters ranging from about 0.010 to 0.25 inch wide and aspect ratios as from about 0.25 to 1 to about 3 to 1.

EMI Shielding effectiveness should be at least 10 dBs, preferably at least 20 dBs over a range of frequencies from about 10 MHz to 10 GHz. More preferably, it should provide an EMI Shielding effectiveness of from about 20 dBs to 80 dBs over a frequency range of from about 10 MHz to 10 GHz. Shielding effectiveness will of course vary with the amount of conductive material present, the deflection imposed upon the gasket and the test method used. All values above assume a typical loading of conductive materials as referenced above, with at least 10% deflection, preferably 10 to 50% deflection and standard MIL spec. test procedures.

The process of applying such form-in-place conductive elastomers preferably includes the use of automated equipment such as robotic applicators, such as x-y, x-y-z and other such multiaxis or rotational type of applicators; hand applicators such as caulking guns; transfer applicators and other such processes.

Preferably, the process relates to the formation of an elastomer which is capable of being formed in place, applying the elastomer to a substrate along a predetermined pathway and curing the elastomer in place.

If desired or required due to the elastomer resin selected and/or its adhesion to a certain substrate, a bonding agent or primer may be used.

For example, some silicone compositions are known to have poor adhesion properties, especially to metal substrates. A primer, such as a silane, silicate ester, a cyanurate or a silicone based adhesive may be used to cause the silicone composition to adhere to the metal substrate.

One preferred process is to use a stationary support or table to which the substrate to be gasketed is fixed in place. A movable applicator, such as a programmable x-y or x-y-z nozzle, which is connected to a supply of form in place elastomer, is positioned adjacent and preferably above the substrate and then caused to travel along a predetermined path, applying the elastomer to the portion of the substrate over which it travels in a desired amount. The elastomer is then cured.

Alternatively, the nozzle may be stationary and the table may be caused to move in two (x-y), three (x-y-z) or more planes of movement.

In a further embodiment, both the nozzle and the table may move in one or more planes relative to each other. One example is where the nozzle moves in two planes (x-y) and is rotational as well and the table is capable of vertical (z) movement.

Other variations and embodiments can be used as well.

Figure 3:
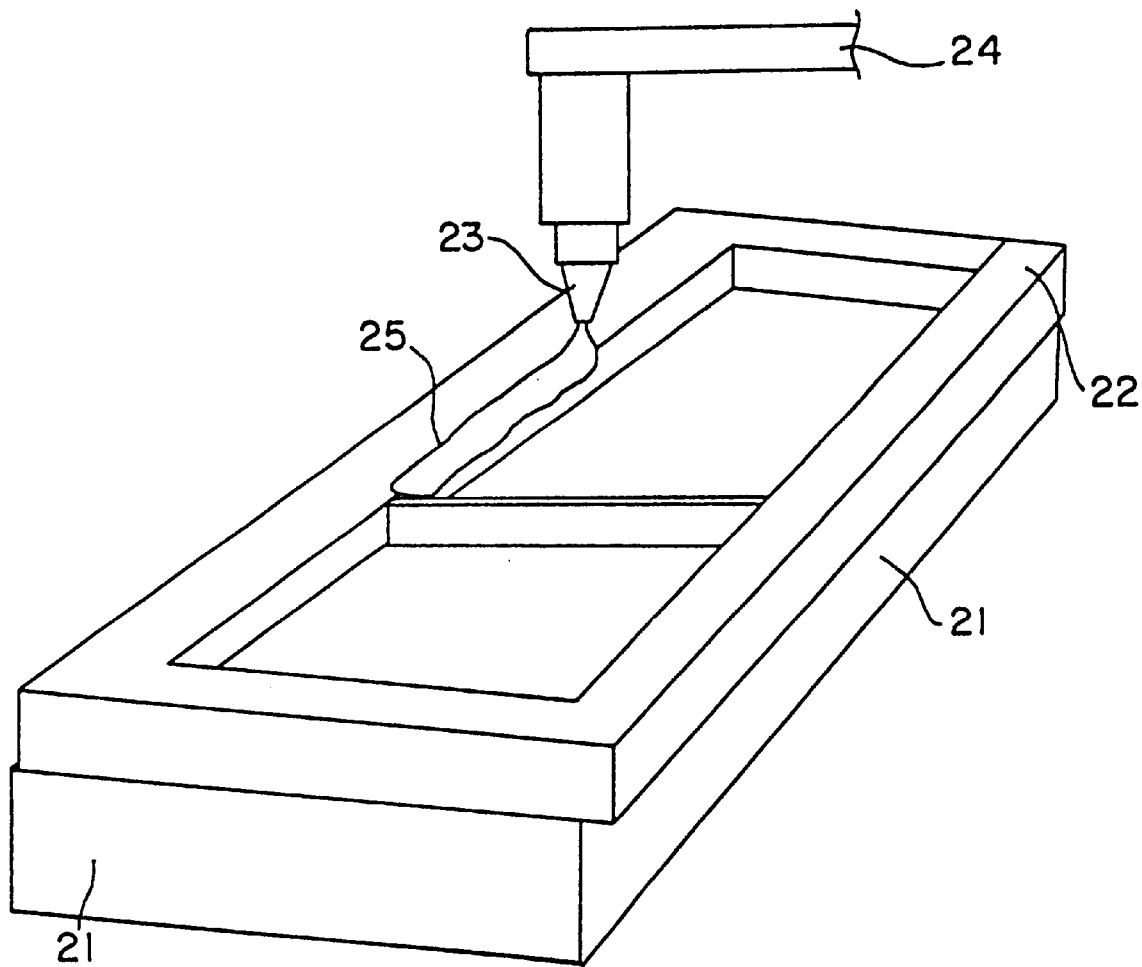
FIG. 3 shows in planar view a preferred system for forming-in-place an EMI gasket, according to the present invention.

A typical system for performing the process is shown in FIG. 3 wherein a support platform or table 21 has a substrate to be gasketed 22 mounted upon it. An applicator, such as the lining dispenser 23 is located over the platform 21. The dispensor is connected to a supply (not shown) of form in place elastomer via a conduit 24.

The dispensor 23 is capable of moving in at least two planes of motion relative to the platform, such as in the x and y axes. Preferably, it is capable of moving in three planes of motion (x, y, z) and may also be rotational so as to accommodate changes in the height or the angle of the substrate 21 over which it passes and applies the elastomer to form a gasket 25 at a desired position.

Figure 4:
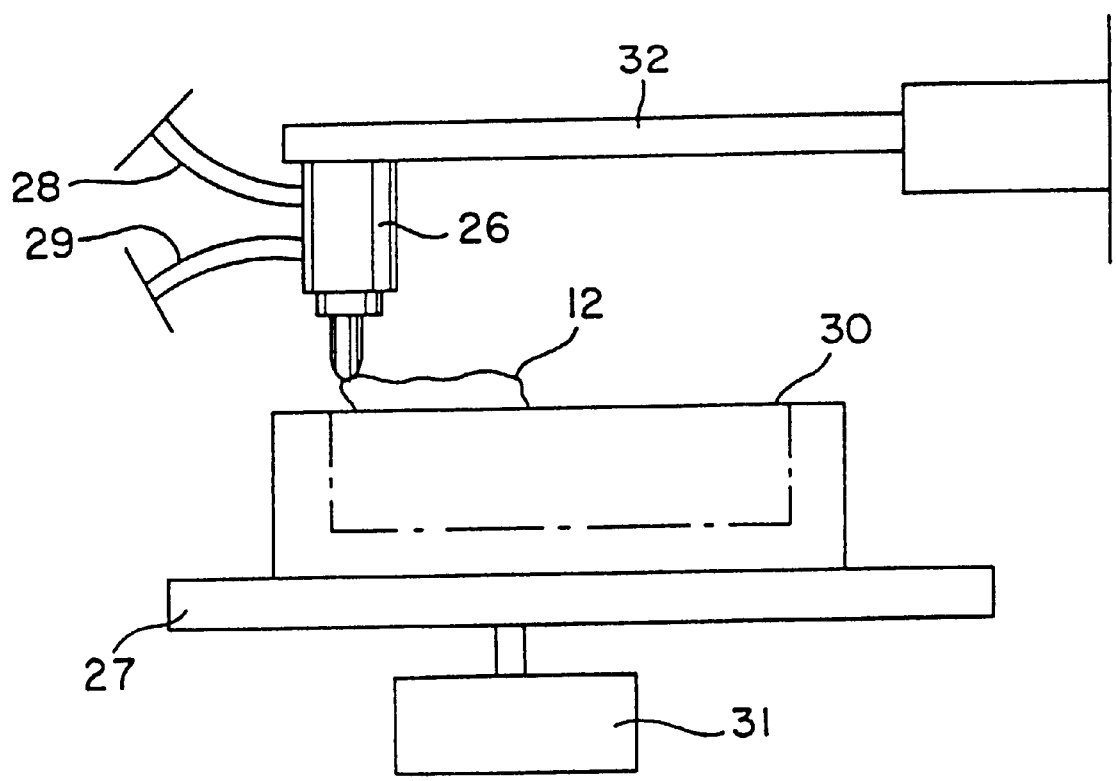
FIG. 4 shows another embodiment of a system of the present invention in crosssection.

FIG. 4 shows another typical system in which the dispenser 26 and the table 27 move relative to each other. Also in this instance, the nozzle has two supply lines 28, 29 which allows for the use of two component systems such as urethanes or the introduction of a gaseous component (air, $CO_2$, nitrogen) into the elastomer just before application so as to form a foamed structure. The table 27 to which the substrate 30 is mounted is moved in one or more directions (x, y and/or z) by a drive mechanism as represented by box 31. The nozzle is moved via a similar drive mechanism 32.

One method of forming the form in place gasket is to mix a silicone rubber preferably in the form of a gel with conductive filler in an amount sufficient to provide EMI shielding. The mixture is then mixed with additional silicone rubber and/or a curing agent or catalyst and then added to a syringe applicator mounted on an x-y applicator arm. The fluid like casket material is then distributed along a peripheral edge of a substrate, such as a cellular phone housing where it cures in place.

Figure 5:
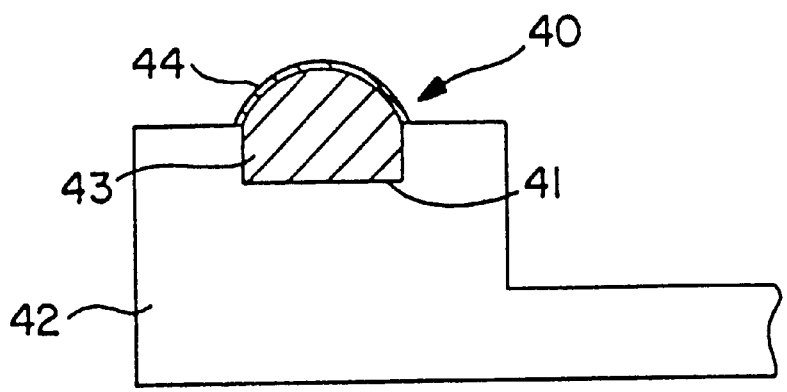
FIG. 5 shows a crosssection of another preferred embodiment of the present invention.

Another method is to form a nonconductive elastomer gasket layer, such as by the process described above and then forming a conductive outer layer over the nonconductive core via spraying, coating, painting or dipping a conductive outer layer onto the core. FIG. 5 shows such an embodiment. The gasket 40 is contained in a channel 41 formed in a substrate 42. The inner layer 43 is covered at least partially with a conductive outer layer 44. The inner layer 43 is preferably nonconductive. However, if desired, it could be conductive, containing e.g. carbon black as a filler.

Alternatively, the nonconductive core can be coated with an adhesive layer which is then flocked with conductive fibers, as taught by U.S. Pat. No. 5,115,104, which is incorporated herein in its entirety.

The gasket may be cured by any of the mechanisms commonly used for the selected polymer so long as the cure does not adversely affect the slump properties of the gasket between application and cure, and/or the physical or electrical properties of the cured gasket.

Some elastomers such as prepolymer based polyurethanes are basically selfcuring in that once the reaction between the isocyanate group and hydroxy group begins, it typically continues until one or both groups are expended.

Other elastomers, such as some silicone and thermoplastic rubbers use chemical curing agents such as peroxide, sulfur, zinc or amines and/or heat to crosslink and cure the resin.

Photocurable resins may also be used via the incorporation of a light sensitive curing agent or photoinitiator which upon exposure to a certain wave length of light (UV, etc.) causes the resin to crosslink and cure.

Some resins use heat to cure. In this instance in order to expedite the cure of the form in place gasket, one may warm the substrate before, during or after application (especially if it is metal) in order to hasten the cure and avoid problems of a cool substrate coating as a heat sink and drawing away heat from the resin. Alternatively, the resin can be heated, such as in the nozzle just before application. The use of hot air or infrared heaters adjacent the substrate may also be used.

Hot melt resins such as those based upon KRATON® rubbers typically need to cool in order to set. Affirmative cooling of the substrate in this instance may be useful. Those hot melts which contain a crosslinking agent may actually need to be kept at an elevated temperature (albeit it below the melting point of the resin) in order to crosslink.

The description above, and that which follows, is only meant to describe one particularly advantageous embodiment of the present invention and as such is only meant to illustrate, not limit it.

EXAMPLE 1

A conductive particle filled solid silicone form-in-place gasket was made of a two component silicone system, mixed in a ratio of 1 part A to 1 part B.

Part A contained:

22.4 parts of silicone resin 77.6 parts of silver plated glass spheres, (avg. size 30–50 microns)

Part B contained:

22.3 of silicone resin 0.4 of a catalyst for the resin 77.3 of silver plated glass spheres (30 to 50 microns average).

Part A and Part B were mixed separately by hand until each was homogenous. Then equal parts were added and mixed by hand until homogenous.

The mixed material was added to a 10 cc syringe with a needle tip of 0.033 diameter. The syringe was mounted onto a dispensing head of a CAM-A-LOT Model 1818 x-y Positioning/Dispensing System. The material was forced out of the syringe via air pressure of about 90 psi in programmed patterns onto an aluminum flange (3 inches diameter, 0.25 inch thickness) which was mounted on a stationary table. The sample was cured in a hot air circulating oven for 60 minutes at 100° C.

The flange was cooled and placed in an Instron machine in a modified ASTM D-575 Compression Testing fixture. Electrodes were placed into the flange opposite facing aluminum surface and the sample was compressed at a rate of 0.005 inch/minute to a total compression of 50% of the original gasket height. During compression, stress, strain and resistivity values were recorded.

Following the compression testing, the flange was removed and bolted to a second flange (with no gasket) until the gasket was compressed to 50% its original height. The assembly was heated in a hot air circulating oven for 22 hours at 85° C. The sample was removed, disassembled and allowed to cool and recover for 30 minutes. The gasket height was remeasured and compression set was calculated as:

$$\% \text{ set} = \frac{\text{Original height} - \text{Final height}}{\text{Original height} - \text{Deflected height}}$$

The results of those tests are shown in Table 1.

EXAMPLE 2

A conductive particle filled foamed silicone gasket was prepared and tested in the manner set forth in Example 1.

The Components of Example 2 were:

Part A 21.6 Silicone RTV Foam
75.7 Silver Powder (325 mesh)
2.7 Toluene

Part B 21.4 - Silicone RTV Foam
74.9 - Silver Powder
1.1 - Catalyst
2.6 - Tolune The results are shown in Table 1.

EXAMPLE 3

A conductive coating over a nonconductive underlayer form-in-place gasket was prepared as follows:

The underlayer was prepared and applied as taught in Example 1. The underlayer or core comprised:

Part A 84.2 - Silicone RTV Foam
10.5 - Cab-o-Sil (silica)
5.3 - Toluene

Part B 80.8 - Silicone RTV Foam
4.0 - Catalyst (Sil gard 184B)
10.1 - Cab-o-Sil (silica)
5.1 - Toluene After formation and cure, a conductive coating formed of silicone RTV, catalyst, solvent and silver coated glass conductive filler was applied by brush to the outer surfaces of the underlayer.

The coating was comprised of two parts:

Part A 11.5 - RTV Silicone
4.71 - Silver Powder
11.8 - Silver Flake
29.6 - Toluene Part B 100 RTV Silicone The results are shown in Table 1.

EXAMPLE 4

A stock, linear piece of conductive gasket, known as CHO-SEAL 1350 gasket, available from Chomerics, Inc. and formed of a conductively filled silicone rod, 0.060 inch in diameter was tested for compression and resistivity values. The results are shown in Table 1.

EXAMPLE 5

A conductive flocked form-in-place was formed of a urethane under layer applied and cured as described in Example 1. The outer layer of the urethane under layer was coated with a flocking adhesive which in turn was covered by a silver plated nylon flock as taught by U.S. Pat. No. 5,115,104 which is incorporated by reference in its entirety. The flocked gasket was placed in a hot air circulating oven for 10 minutes at 200° F. to cure the adhesive. The flocked gasket was found to provide EMI shielding over a wide range of frequencies.

EXAMPLE 6

A urethane form-in-place conductive gasket was prepared, assembled and tested according to the procedures of Example 1.

The gasket was formed of:

100 grams—urethane prepolymer 3 grams—activator 360 grams—silver powder 1.5 grams—silica (as a reinforcing filler)

The gasket was applied to and adhered to a substrate. The gasket was found to provide adequate EMI shielding over a wide range of frequencies.

TABLE 1

| EXAMPLE | FORCE/DEFLECTION (lb/inch) | | | | Electrical Resistance (ohms) at stated Force/Deflection (lb/inch) | | | | Compression Set (%) |
| --- | --- | --- | --- | --- | --- | --- | --- | --- | --- |
| | 10% | 20% | 30% | 40% | 10% | 20% | 30% | 40% | |
| #1 | .5 | 1.5 | 2.7 | 4.3 | .060 | .020 | .011 | .007 | 13 |
| #2 | .7 | 2.2 | 4.0 | 6.2 | .050 | .010 | .007 | .002 | 50 |
| #3 | .3 | 1.3 | 2.5 | 4.0 | .063 | .024 | .018 | .016 | 41 |
| #4 | 2.4 | 4.9 | 8.4 | 13.7 | .037 | .016 | .010 | .007 | 30 |

What we claim:

1. An EMI gasket consisting essentially of a polyester having isocyanate of trialkoxy silyl end groups capable of chemically reacting with each other at room temperature in the presence of moisture to form a derivative polymer having a longer chain length than the polyester; and at least one electrically conductive filler intimately mixed with the derivative polymer to form a composition which, when maintained in the absence of moisture and other hydrogen donor materials, is a readily extrudable and otherwise conventionally moldable thermoplastic material which, upon exposure to moisture at room temperature, becomes essentially thermosetting, said gasket having a Shore A hardness of from about 5 to about 60, a force/deflection value of from about 0.2 pounds/inch to 15.0 pounds/inch, an electrical resistance value of from about 0.005 ohms to 0.1 ohms, a compression set value of from about 5% to about 50%, and an EMI shielding effectiveness of from about 10 dbs to about 120 dbs at a frequency range of from about 10 MHz to about 10 GHz.

2. The gasket according to claim 1, wherein the gasket has a shore A hardness of from about 5 to about 50.

3. The gasket according to claim 1, wherein the gasket has a shore A hardness of from about 5 to about 40.

4. The gasket according to claim 1, wherein the gasket has a diameter of form about 0.01 inches to about 0.025 inches.

5. The gasket according to claim 1, which also includes a noncross-linked elastomer that is not substantially chemically reactive with itself and with said primary polymer.

6. The gasket of according to claim 1, wherein the electrically conductive filler is selected from the group consisting of noble metal fillers, noble metal-plated noble metals, noble metal plated non-noble metals, noble metal-plated glass, noble metal-plated plastic, noble metal-plated ceramics, noble metal-plated mica, non-noble metals, non-noble metal-plated non-noble metals, carbon black, and graphite.

7. An EMI gasket comprising a polyester having isocyanate or trialkoxysilyl end groups capable of chemically reacting with each other at room temperature in the presence of moisture to form a derivative polymer having a longer chain length than the polyester; and at least one electrically conductive filler intimately mixed with the derivative polyester to form a composition which, when maintained in the absence of moisture and other hydrogen donor materials, is a readily extrudable and otherwise conventionally moldable thermoplastic material which, upon exposure to moisture at room temperature, becomes essentially thermosetting.

* * * * *